(12) United States Patent
Yang (10) Patent No.: US 9,923,457 B2
(45) Date of Patent: Mar. 20, 2018

(54) REGULATED POWER CONVERTER AND METHOD OF OPERATING THE SAME

(71) Applicant: TAIWAN SEMICONDUCTOR MANUFACTURING COMPANY, LTD., Hsinchu (TW)

(72) Inventor: Tien-Chun Yang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 36 days.

(21) Appl. No.: 14/694,402

(22) Filed: Apr. 23, 2015

(65) Prior Publication Data

US 2016/0315537 A1   Oct. 27, 2016

(51) Int. Cl.
| | | |
|---|---|---|
| H02M 3/07 | (2006.01) | |
| G05F 1/56 | (2006.01) | |
| H02M 1/00 | (2006.01) | |
| G11C 5/14 | (2006.01) | |

(52) U.S. Cl.
CPC .............. *H02M 3/07* (2013.01); *G05F 1/56* (2013.01); *G11C 5/145* (2013.01); *H02M 3/073* (2013.01); *H02M 2001/008* (2013.01)

(58) Field of Classification Search
CPC .. H02M 3/07; H02M 3/073; H02M 2001/007; H02M 2001/008; H02M 2001/0045; G05F 1/56; G05F 1/1465; G05F 1/465; G11C 5/145

See application file for complete search history.

(56) References Cited

U.S. PATENT DOCUMENTS 6,115,272 A  *  9/2000  Pasternak  ............... H02M 3/07
                                                    363/60
6,172,553 B1     1/2001  Murray et al.
(Continued)

FOREIGN PATENT DOCUMENTS

CN   102290984   12/2011
CN   104242630   12/2014
(Continued)

OTHER PUBLICATIONS

Notice of Allowance dated Aug. 19, 2016 from corresponding No. TW 104138703.
(Continued)

*Primary Examiner* — Yusef Ahmed
(74) *Attorney, Agent, or Firm* — Hauptman Ham, LLP (57) ABSTRACT

An intellectual property (IP) block portion in an integrated circuit includes a first regulator, a first circuit, a power converter, and a second circuit. The first regulator is configured to receive a supply voltage and to generate a first output voltage. The first circuit is coupled with the first regulator and configured to receive the first output voltage. The power converter includes a charge pump configured to receive the supply voltage and to generate a pumped voltage; and a second regulator configured to receive the supply voltage or the pumped voltage and to generate a second output voltage. The second output voltage has a voltage level greater than a voltage level of the first output voltage. The second circuit is coupled with the power converter and configured to receive the second output voltage.

19 Claims, 9 Drawing Sheets

(56) References Cited

U.S. PATENT DOCUMENTS

| | | | |
|---|---|---|---|
| 7,271,503 B2* | 9/2007 | Nonaka | H02J 1/08 307/45 |
| 7,579,902 B2 | 8/2009 | Frulio et al. | |
| 7,587,190 B2* | 9/2009 | Balachandran | G06F 1/3203 340/572.1 |
| 7,599,231 B2 | 10/2009 | Passerini et al. | |
| 7,706,902 B2* | 4/2010 | Heubi | H04R 25/305 381/317 |
| 8,471,537 B2 | 6/2013 | Joo | |
| 8,598,854 B2 | 12/2013 | Soenen et al. | |
| 8,629,694 B1 | 1/2014 | Wang et al. | |
| 8,629,706 B2 | 1/2014 | Chen et al. | |
| 8,816,670 B2 | 8/2014 | Lee et al. | |
| 2003/0067289 A1* | 4/2003 | Morita | G09G 3/3611 323/282 |
| 2006/0082351 A1* | 4/2006 | Martins | H02J 9/005 323/268 |
| 2007/0211502 A1* | 9/2007 | Komiya | H02M 3/07 363/59 |
| 2008/0089140 A1* | 4/2008 | Passerini | G11C 7/02 365/189.09 |
| 2009/0027110 A1* | 1/2009 | Lee | G05F 1/563 327/538 |
| 2009/0039840 A1* | 2/2009 | Lee | G11C 5/145 323/266 |
| 2009/0315598 A1* | 12/2009 | Namekawa | H02M 3/073 327/157 |
| 2010/0074030 A1* | 3/2010 | Passerini | G11C 7/02 365/189.02 |
| 2010/0171544 A1* | 7/2010 | Seo | H02M 3/07 327/536 |
| 2010/0219687 A1* | 9/2010 | Oh | G05F 1/46 307/39 |
| 2010/0295520 A1* | 11/2010 | Gamet | H02M 3/07 323/234 |
| 2011/0227553 A1* | 9/2011 | Joo | G11C 5/145 323/311 |
| 2012/0077551 A1* | 3/2012 | Balteanu | G05F 1/56 455/572 |
| 2012/0106251 A1* | 5/2012 | Im | G11C 5/145 365/185.03 |
| 2012/0126763 A1 | 5/2012 | Yang | |
| 2012/0176186 A1 | 7/2012 | Chen et al. | |
| 2013/0083573 A1* | 4/2013 | Ryu | H02M 3/07 363/60 |
| 2013/0241510 A1 | 9/2013 | Shi et al. | |
| 2013/0307516 A1 | 11/2013 | Horng et al. | |
| 2013/0320944 A1 | 12/2013 | Siao | |
| 2014/0002041 A1 | 1/2014 | Soenen et al. | |
| 2014/0266114 A1 | 9/2014 | Chern et al. | |
| 2014/0375127 A1 | 12/2014 | Shih et al. | |
| 2015/0171743 A1* | 6/2015 | Yeon | H02M 1/44 320/107 |
| 2016/0241218 A1* | 8/2016 | Muneyasu | H03K 3/013 |

FOREIGN PATENT DOCUMENTS

| | | |
|---|---|---|
| TW | 200828750 | 7/2008 |
| TW | 201403611 | 1/2014 |

OTHER PUBLICATIONS

Office Action dated Jan. 30, 2018 from corresponding application No. CN 201510808485.1.

* cited by examiner

REGULATED POWER CONVERTER AND METHOD OF OPERATING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of an IC. In some applications, an IC includes different intellectual property (IP) block portions configured to be powered by power supply voltages having different voltage levels. An IP block portion incorporates an IP block that is a reusable circuit design and is usually the intellectual property of an IP block vendor. In some applications, even an IP block portion includes multiple circuit blocks configured to be powered by power supply voltages having different voltage levels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments of the present application, an intellectual property (IP) block portion of an integrated circuit (IC) includes a regulator configured to convert a supply voltage to a first output voltage and a power converter configured to convert the same supply voltage to a second output voltage. To other circuit portions outside the IP block portion in the IC, the IP block portion receives a single voltage source (i.e., the supply voltage). Compared with other IP block portions that receive voltage sources having different voltage levels, the IP block portion according to the present disclosure has a simplified power source interface. Also, in some embodiments, the power converter includes a charge pump and another regulator. In some embodiments, the power converter includes two switches configured to electrically couple the supply voltage or a pumped voltage from the charge pump to the regulator of the power converter.

Figure 1:
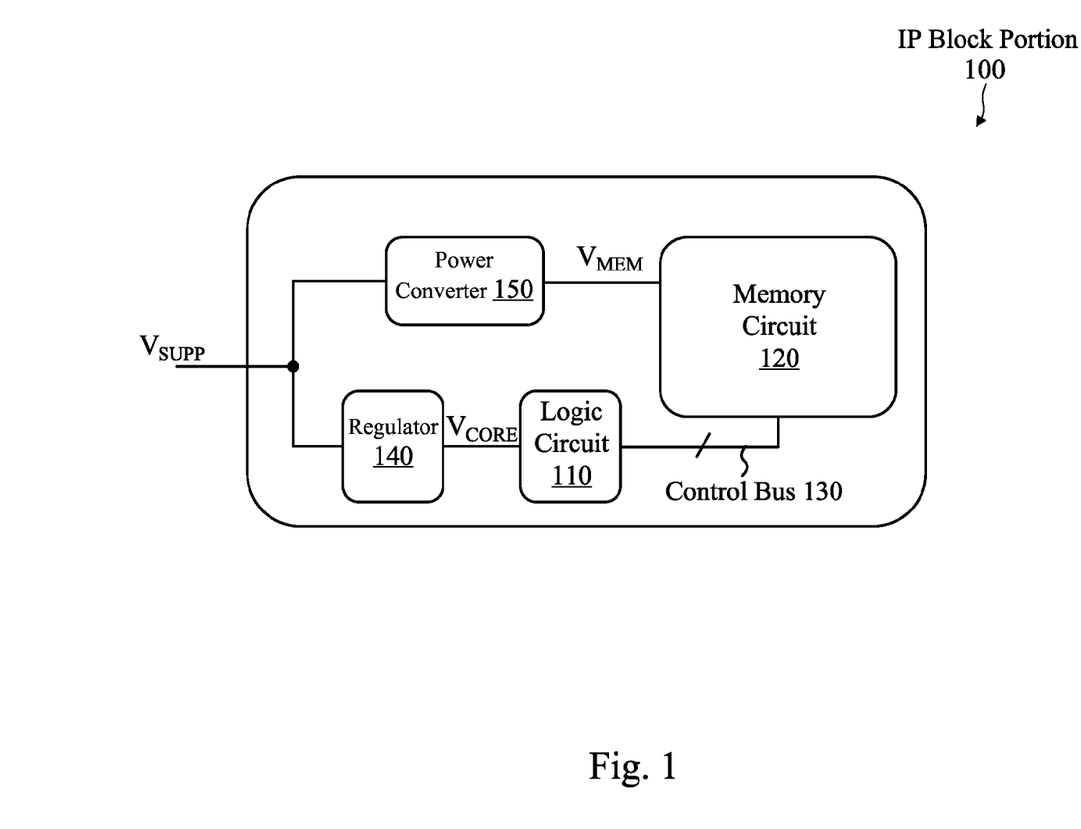
FIG. 1 is a schematic diagram of an IP block portion of an IC in accordance with one or more embodiments.

FIG. 1 is a schematic diagram of an IP block portion 100 of an IC in accordance with one or more embodiments. IP block portion 100 includes a logic circuit 110, a memory circuit 120, a control bus 130 electrically coupled with logic circuit 110 and memory circuit 120, a regulator 140 electrically coupled with logic circuit 110, and a power converter 150 electrically coupled with memory circuit 120. Both regulator 140 and power converter 150 receive a supply voltage $V_{SUPP}$ external to the IP block portion 100.

Logic circuit 110 is configured to control the operation of memory circuit 120 through control bus 130. Memory circuit 120 includes a memory cell array configured to store a predetermined number of bits of data. In some embodiments, the memory cells of the memory cell array in memory circuit 120 are non-volatile memory cells, such as flash memory cells, resistive random-access memory (RRAM) cells, magnetoresistive random-access memory (MRAM), or phase-change random-access memory (PRAM) cells. In some embodiments, the memory cells of the memory cell array in memory circuit 120 are volatile memory cells, such as static random-access memory (SRAM) cells or dynamic random-access memory (DRAM) cells. In some embodiments, the memory cells of the memory cell array in memory circuit 120 are read-only memory (ROM) cells or programmable read-only memory (PROM) cells.

Regulator 140 is configured to receive a supply voltage $V_{SUPP}$ and to convert supply voltage $V_{SUPP}$ to an output voltage $V_{CORE}$. Logic circuit 110 is powered by voltage $V_{CORE}$. In some embodiments, the voltage level of voltage $V_{CORE}$ ranges from 0.7 V to 1.2 V. In some embodiments, regulator 140 is a low dropout regulator and is designed to operate normally when a voltage difference between an input unregulated voltage and an output regulated voltage thereof is greater than a value, and the value is referred to as a first predetermined minimum voltage drop. In some embodiments, the voltage level of voltage $V_{SUPP}$ is greater than the voltage level of voltage $V_{CORE}$ by at least the first predetermined minimum voltage drop of regulator 140. In some embodiments, the first predetermined minimum voltage drop of regulator 140 ranges from 100 mV to 300 mV.

Power converter 150 is configured to receive supply voltage $V_{SUPP}$ and to convert supply voltage $V_{SUPP}$ to another output voltage $V_{MEM}$. Memory circuit 120 is powered by voltage $V_{MEM}$. In some embodiments, a voltage level of voltage $V_{MEM}$ is greater than a voltage level of voltage $V_{CORE}$. In some embodiments, the memory cells in memory circuit 120 are flash memory cells, and the voltage level of voltage $V_{MEM}$ ranges from 2.5 V to 18.0 V. In some embodiments, the memory cells in memory circuit 120 are RRAM cells or MRAM cells, and the voltage level of voltage $V_{MEM}$ ranges from 0.9 V to 5.0 V.

Power converter 150 will be further illustrated in conjunction with FIGS. 2-6C.

Logic circuit 110 and memory circuit 120 are introduced as example circuit block portions within IP block portion 100 that are configured to be powered by supply voltages $V_{CORE}$ and $V_{MEM}$ having different voltage levels. In some embodiments, IP block portion 100 has circuit block portions different from logic circuit 110 or memory circuit 120. In some embodiments, IP block portion 100 has three or more circuit block portions that are configured to be powered by three or more corresponding voltage levels.

Figure 2:
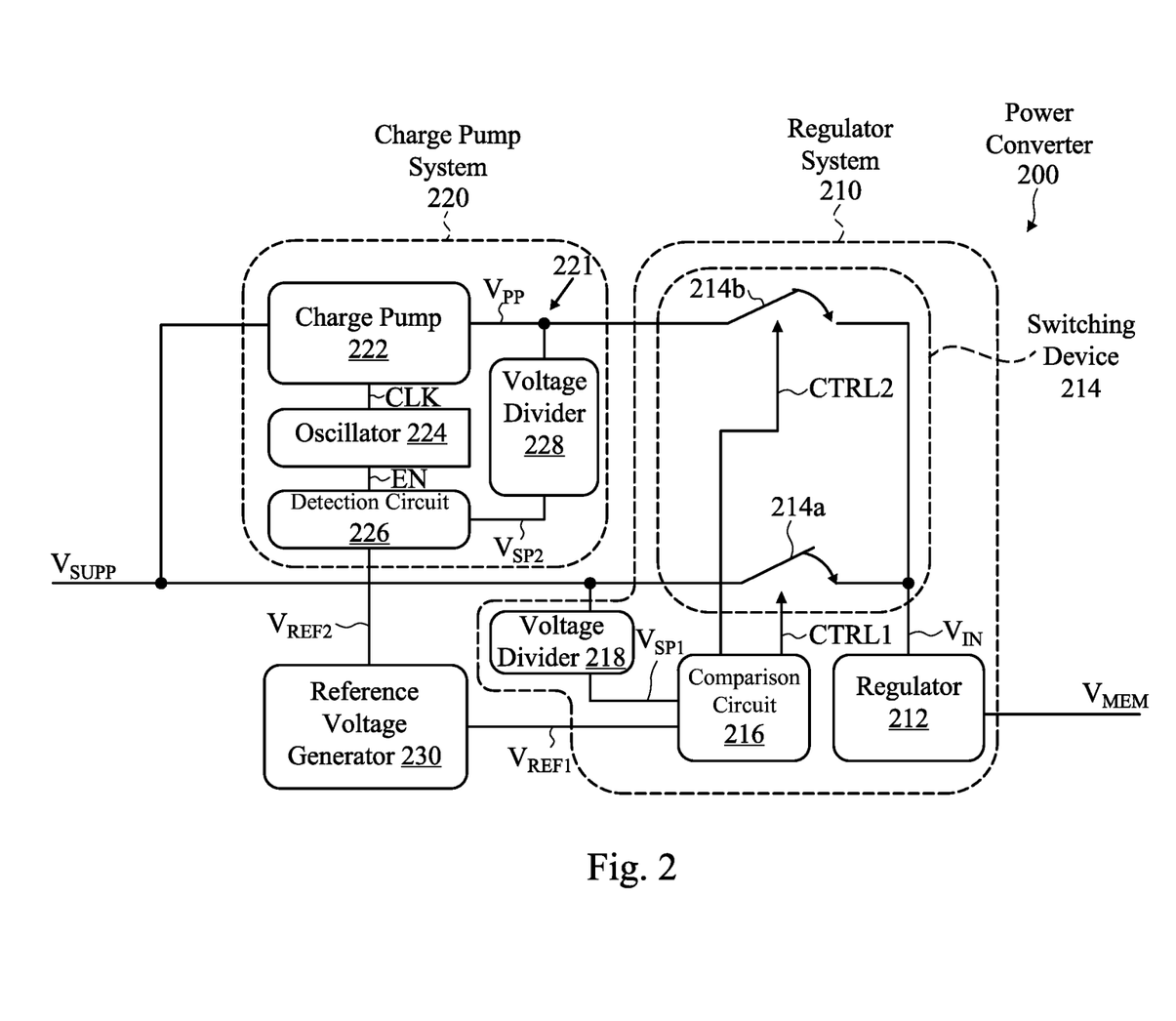
FIG. 2 is a schematic diagram of an example power converter usable in the IP block portion depicted in FIG. 1 in accordance with one or more embodiments.

FIG. 2 is a schematic diagram of an example power converter 200 usable in IP block portion 100 depicted in FIG. 1 as power converter 150 in accordance with one or more embodiments. Components in FIG. 2 that are the same or similar to those in FIG. 1 are given the same reference numbers or labels, and detailed description thereof is thus omitted.

Power converter 200 includes a regulator system 210, a charge pump system 220, and a reference voltage generator 230. Regulator system 210 is configured to receive supply voltage $V_{SUPP}$ and a pumped voltage $V_{PP}$ and to generate output voltage $V_{MEM}$. Charge pump system 220 is configured to receive supply voltage $V_{SUPP}$ and to generate pumped voltage $V_{PP}$ at output node 221 of charge pump system 220. Reference voltage generator 230 is configured to provide a reference voltage $V_{REF1}$ to regulator system 210 and a reference voltage $V_{REF2}$ to charge pump system 220.

Regulator system 210 includes a regulator 212, a switching device 214, a comparison circuit 216, and a voltage divider 218. Regulator 212 is configured to receive supply voltage $V_{SUPP}$ or pumped voltage $V_{PP}$ as an input voltage $V_{IN}$ through switching device 214 and to generate output voltage $V_{MEM}$. Switching device 214 includes switch 214a between regulator 212 and supply voltage $V_{SUPP}$ and switch 214b between regulator 212 and pumped voltage $V_{PP}$. Switch 214a is configured to be turned on or off responsive to a control signal CTRL1, and Switch 214b is configured to be turned on or off responsive to a control signal CTRL2. In some embodiments, switch 214a and switch 214b are P-type transistors, N-type transistors, or transmission gates.

Comparison circuit 216 is configured to receive reference voltage $V_{REF1}$ and a sampled voltage $V_{SP1}$ and to generate control signals CTRL1 and CTRL2. Voltage divider 218 is configured to generate a divided voltage as sampled voltage $V_{SP1}$ based on dividing supply voltage $V_{SUPP}$ by a predetermined voltage-dividing ratio M. M is a non-zero, positive number. In some embodiments, voltage divider 218 is omitted, and supply voltage $V_{SUPP}$ is passed to comparison circuit 216 as sampled voltage $V_{SP1}$. When voltage divider 218 is omitted, voltage-dividing ratio M is deemed to be 1.

Based on comparing voltage levels of sampled voltage $V_{SP1}$ and reference voltage $V_{REF1}$, comparison circuit 216 determines if the voltage level of supply voltage $V_{SUPP}$ is greater or less than a first predetermined threshold voltage level. In some embodiments, when comparison circuit 216 determines that the voltage level of supply voltage $V_{SUPP}$ is equal to or greater than the first predetermined threshold voltage level, comparison circuit 216 causes switch 214b to be turned off and switch 214a to be turned on in order to pass supply voltage $V_{SUPP}$ to regulator 212. In some embodiments, when comparison circuit 216 determines that the voltage level of supply voltage $V_{SUPP}$ is equal to or greater than the first predetermined threshold voltage level, comparison circuit 216 also causes charge pump system 220 to be disabled. In some embodiments, when comparison circuit 216 determines that the voltage level of supply voltage $V_{SUPP}$ is less than the first predetermined threshold voltage level, comparison circuit 216 causes switch 214a to be turned off and switch 214b to be turned on in order to pass pumped voltage $V_{PP}$ to regulator 212.

In some embodiments, regulator 212 is a low dropout regulator and is designed to operate normally when a voltage difference between input voltage $V_{IN}$ and output voltage $V_{MEM}$ is greater than a value, and the value is referred to as a second predetermined minimum voltage drop. In some embodiments, the first predetermined threshold voltage level is set to be greater than a target voltage level of voltage $V_{MEM}$ by at least the second predetermined minimum voltage drop of regulator 212. In some embodiments, the voltage level of reference voltage $V_{REF1}$ is set based on dividing the first predetermined threshold voltage level by the predetermined voltage-dividing ratio M of voltage divider 218.

Charge pump system 220 includes a charge pump 222, an oscillator 224, a detection circuit 226, and a voltage divider 228. Charge pump 222 is configured to receive supply voltage $V_{SUPP}$ and to generate pumped voltage $V_{PP}$ based on a clock signal CLK. Oscillator 224 is configured to output clock signal CLK. Detection circuit 226 is configured to determine if a voltage level of pumped voltage $V_{PP}$ is greater or less than a second predetermined threshold voltage level by comparing a sampled voltage $V_{SP2}$ against reference voltage $V_{REF2}$. Detection circuit 226 is also configured to enable or disable oscillator 224 through an enable signal EN. In some embodiments, when detection circuit 226 determines that the voltage level of pumped voltage $V_{PP}$ is less than the second predetermined threshold voltage level, oscillator 224 is enabled. In some embodiments, when detection circuit 226 determines that the voltage level of pumped voltage $V_{PP}$ is equal to or greater than the second predetermined threshold voltage level, oscillator 224 is disabled. In some embodiments, detection circuit 226 is configured to receive control signal CTRL1 or control signal CTRL2 and to disable oscillator 224 when control signal CTRL1 or control signal CTRL2 indicate that switch 214a is turned on and switch 214b is turned off.

Voltage divider 228 is configured to generate a divided voltage as sampled voltage $V_{SP2}$ based on dividing pumped voltage $V_{PP}$ by a predetermined voltage-dividing ratio N. N is a non-zero, positive number. In some embodiments, voltage divider 228 is omitted, and pumped voltage $V_{PP}$ is passed to detection circuit 226 as sampled voltage $V_{SP2}$. When voltage divider 228 is omitted, voltage-dividing ratio N is deemed to be 1.

In some embodiments, a target voltage level of pumped voltage $V_{PP}$ is set to be greater than the target voltage level of voltage $V_{MEM}$ by at least the second predetermined minimum voltage drop of regulator 212. The second predetermined threshold voltage level used by detection circuit 226 is set based on a summation of the target voltage level of pumped voltage $V_{PP}$ and a predetermined voltage ripple tolerance of charge pump 222. In some embodiments, the voltage level of reference voltage $V_{REF2}$ is set based on dividing the second predetermined threshold voltage level by the predetermined voltage-dividing ratio N of voltage divider 228. In some embodiments, the second predetermined minimum voltage drop of regulator 212 ranges from 100 mV to 300 mV. In some embodiments, the predetermined voltage ripple tolerance of charge pump 222 ranges from 100 mV to 300 mV.

Figure 3:
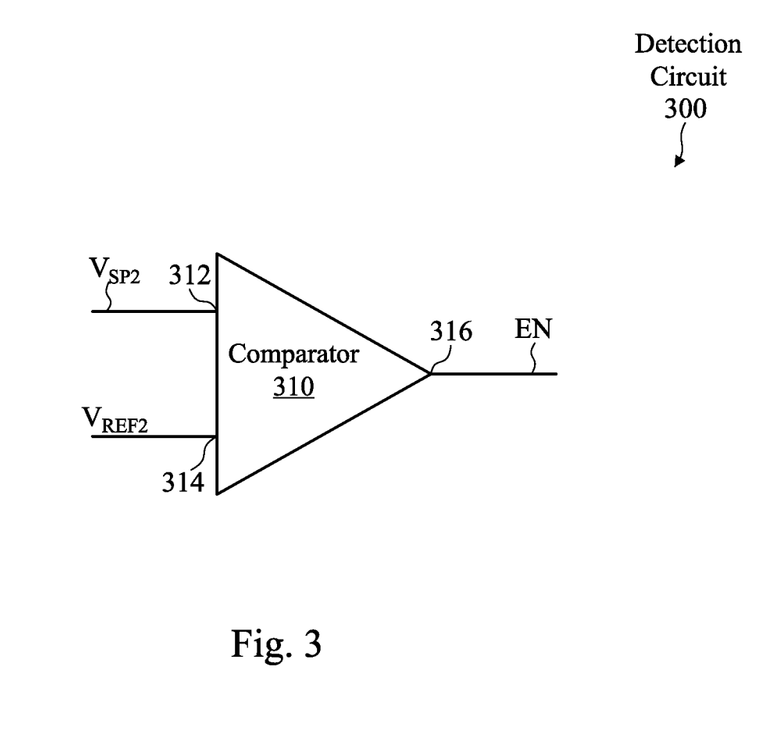
FIG. 3 is a schematic diagram of an example detection circuit usable in the power converter depicted in FIG. 2 in accordance with one or more embodiments.

FIG. 3 is a schematic diagram of an example detection circuit 300 usable in the power converter 200 depicted in FIG. 2 as detection circuit 226 in accordance with one or more embodiments. Components in FIG. 3 that are the same or similar to those in FIG. 2 are given the same reference numbers or labels, and detailed description thereof is thus omitted.

Detection circuit 300 includes a comparator 310. Comparator 310 includes two input terminals 312 and 314 and an output terminal 316. Comparator 310 is configured to receive sampled voltage $V_{SP2}$ at input terminal 312 and to receive reference voltage $V_{REF2}$ at input terminal 314. Comparator 310 is also configured to generate an output signal at terminal 316 indicating a result of comparing sampled voltage $V_{SP2}$ and reference voltage $V_{REF2}$ and the output signal is used as enable signal EN.

Figure 4:
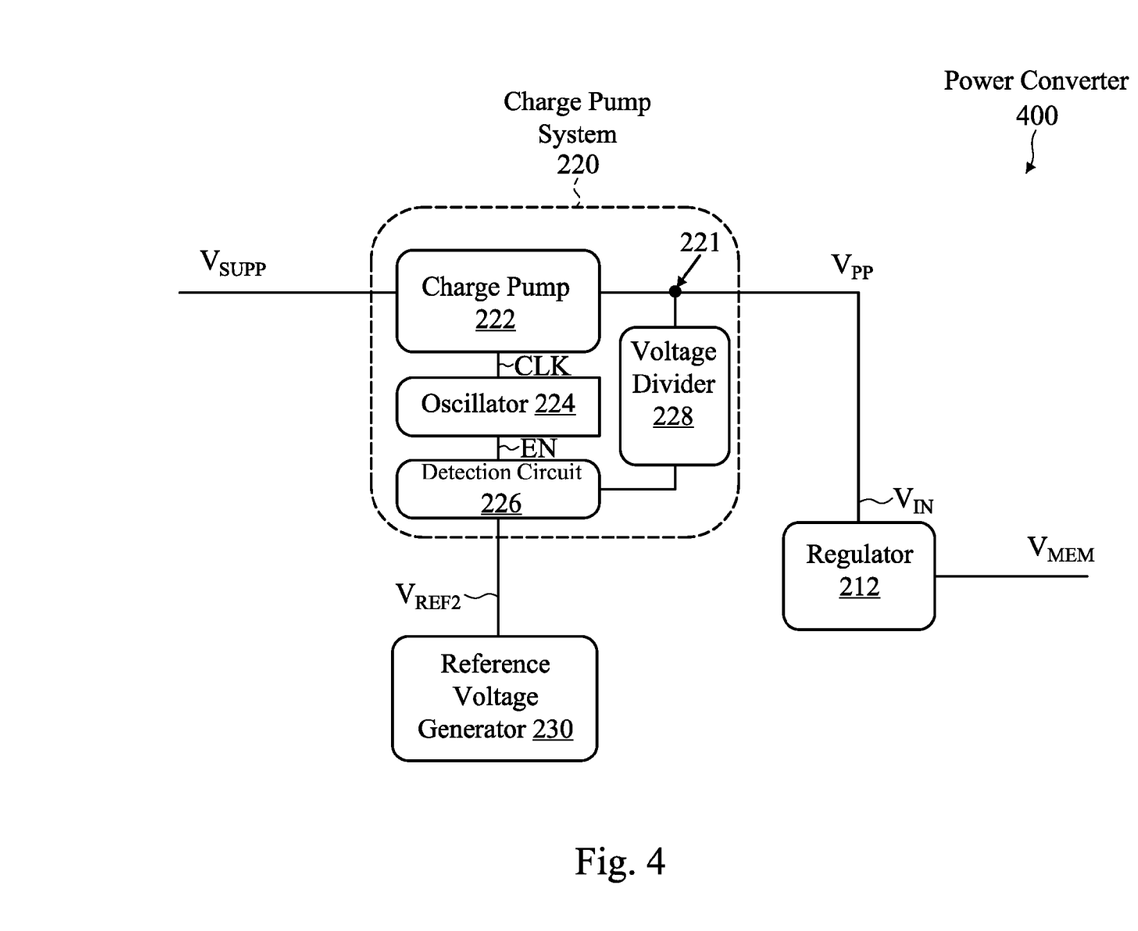
FIG. 4 is a schematic diagram of another example power converter usable in the IP block portion depicted in FIG. 1 in accordance with one or more embodiments.

FIG. 4 is a schematic diagram of another example power converter 400 usable in the IP block portion 100 depicted in FIG. 1 as power converter 150 in accordance with one or more embodiments. Components in FIG. 4 that are the same or similar to those in FIG. 2 are given the same reference numbers or labels, and detailed description thereof is thus omitted.

Compared with power converter 200, power converter 400 does not have components corresponding to switching device 214, comparison circuit 216, and voltage divider 218 in FIG. 2. Regulator 212 is thus configured to receive pumped voltage $V_{PP}$ as input voltage $V_{IN}$ and to generate output voltage $V_{MEM}$ regardless of the voltage level of supply voltage $V_{SUPP}$. Compared with power converter 200, power converter 400 has a reduced number of electrical components at the expense of greater power consumption attributable to the omission of possibly bypassing charge pump 222 by switch 214a.

Figure 5:
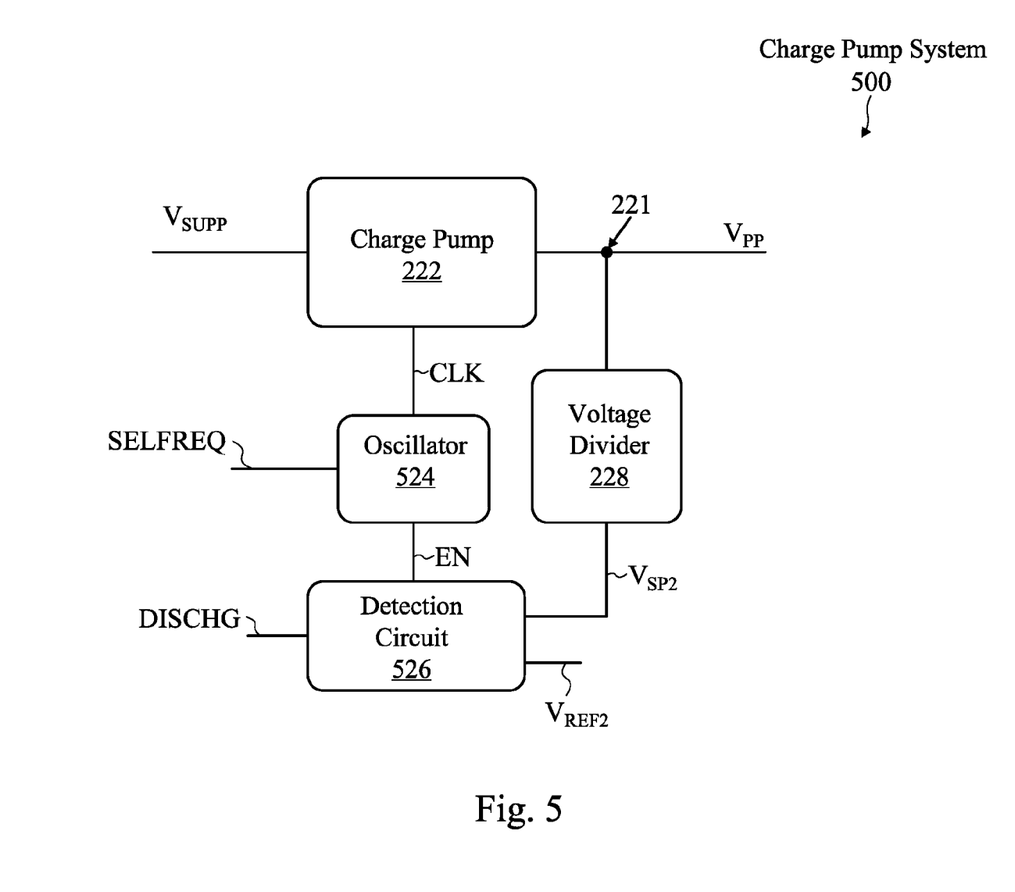
FIG. 5 is a schematic diagram of another example charge pump system usable in the power converter depicted in FIG. 2 or the power converter depicted in FIG. 4 in accordance with one or more embodiments.

FIG. 5 is a schematic diagram of another example charge pump system 500 usable in the power converter 200 depicted in FIG. 2 as charge pump system 220 or the power converter 200 depicted in FIG. 4 as charge pump system 220 in accordance with one or more embodiments. Components in FIG. 5 that are the same or similar to those in FIG. 2 are given the same reference numbers or labels, and detailed description thereof is thus omitted.

Compared with charge pump system 220 in FIG. 2 or FIG. 4, charge pump system 500 replaces oscillator 224 with oscillator 524 and replaces detection circuit 226 with detection circuit 526. Oscillator 524 is configured to output clock signal CLK at a plurality of different, non-zero, frequencies in response to one or more selection signals SELFREQ. Moreover, detection circuit 526 is configured to enable or disable oscillator 526 based on whether a voltage level of pumped voltage $V_{PP}$ is greater than or less than a second predetermined threshold voltage level in a manner similar to detection circuit 226 described above. Detection circuit 526 is also configured to discharge voltage $V_{PP}$ in response to a discharge signal DISCHG. In some embodiments, when detection circuit 526 is set to discharge voltage $V_{PP}$, detection circuit 526 also disables oscillator 524.

In some embodiments, detection circuit 226 is not replaced by detection circuit 526, and a resulting charge pump system includes oscillator 524 working with detection circuit 226. In some embodiments, oscillator 224 is not replaced by oscillator 524, and a resulting charge pump system includes oscillator 224 working with detection circuit 526.

Figure 6A:
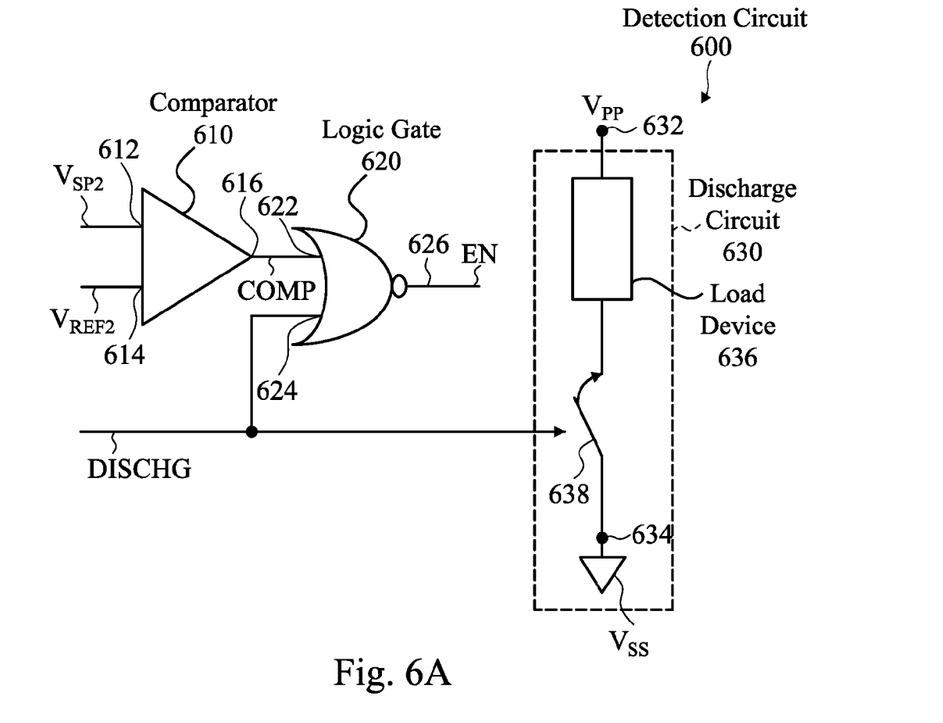
FIG. 6A is a schematic diagram of an example detection circuit usable in the charge pump system depicted in FIG. 5 in accordance with one or more embodiments.

FIG. 6A is a schematic diagram of an example detection circuit 600 usable in the charge pump system 500 depicted in FIG. 5 as detection circuit 526 in accordance with one or more embodiments. Components in FIG. 6 that are the same or similar to those in FIG. 5 are given the same reference numbers or labels, and detailed description thereof is thus omitted.

Detection circuit 600 includes a comparator 610, a logic gate 620, and a discharge circuit 630. Comparator 610 includes two input terminals 612 and 614 and an output terminal 616. Comparator 610 is configured to receive sampled voltage $V_{SP2}$ at input terminal 612 and to receive reference voltage $V_{REF2}$ at input terminal 614. Comparator 610 is also configured to generate an output signal COMP at terminal 616 indicating a result of comparing sampled voltage $V_{SP2}$ and reference voltage $V_{REF2}$. Logic gate 620 is a NOR gate including two input terminals 622 and 624 and an output terminal 626.

Logic gate 620 is configured to receive signal COMP and discharge signal DISCHG and generate an output signal used as enable signal EN. In operation, when discharge signal DISCHG is logically high indicating that discharge circuit 630 is enabled, or when signal COMP is logically high indicating that pumped voltage $V_{PP}$ is greater than the second predetermined threshold voltage level, EN is logically low to disable oscillator 524.

Discharge circuit 630 is configured to lower the voltage level of pumped voltage $V_{PP}$ in response to discharge signal DISCHG. Discharge circuit 630 includes a first end 632 electrically coupled with output node 221, which carries pumped voltage $V_{PP}$, and a second end 634 electrically coupled with a reference voltage $V_{SS}$. In some embodiments, reference voltage $V_{SS}$ is ground or a reference supply voltage. Discharge circuit 630 also includes a load device 636 and a switch 638 electrically connected in series between first end 632 and second end 634. Switch 638 is configured to be turned on or turned off responsive to discharge signal DISCHG. In some embodiments, when discharge signal DISCHG is logically high, switch 638 is turned on, and discharge circuit 630 is enabled to discharge pumped voltage $V_{PP}$ toward voltage $V_{SS}$ through load device 636. In some embodiments, when discharge signal DISCHG is logically low, switch 638 is turned off, and discharge circuit 630 is disabled to avoid electrically coupling output node 221 with reference voltage $V_{SS}$ through load device 636.

Various logical levels and the type of logic gate 620 illustrated in this disclosure is provided as an example. In some embodiments, one or more of discharge signal DISCHG enable signal EN, and/or comparison signal COMP use logical levels different from the example illustrated in this disclosure and are contemplated as would normally occur to one of ordinary skill in the relevant art.

Figure 6B:
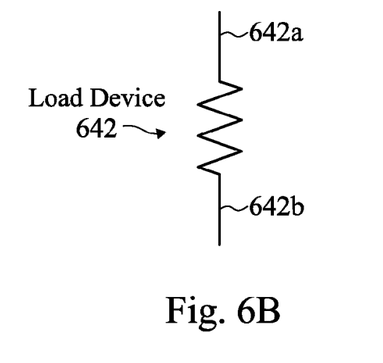
FIG. 6B and FIG. 6C are schematic diagrams of example load devices usable in the detection circuit depicted in FIG. 6A in accordance with one or more embodiments.

FIG. 6B is a schematic diagram of an example load device 642 usable in the detection circuit 600 depicted in FIG. 6A as load device 636 in accordance with one or more embodiments. Load device 642 is a resistive device having a first end 642a electrically coupled toward pumped voltage $V_{PP}$ and a second end 642b electrically coupled toward reference voltage $V_{SS}$.

Figure 6C:
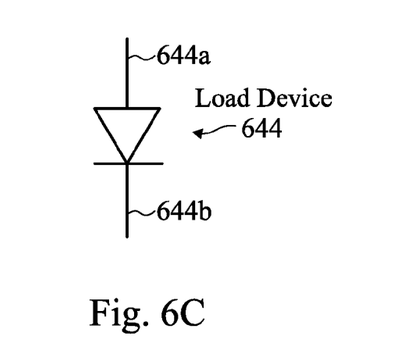

FIG. 6C is a schematic diagram of another example load device 644 usable in the detection circuit 600 depicted in FIG. 6A as load device 636 in accordance with one or more embodiments. Load device 644 is a diode having an anode 644a electrically coupled toward pumped voltage $V_{PP}$ and a cathode 644b electrically coupled toward reference voltage $V_{SS}$.

Figure 7:
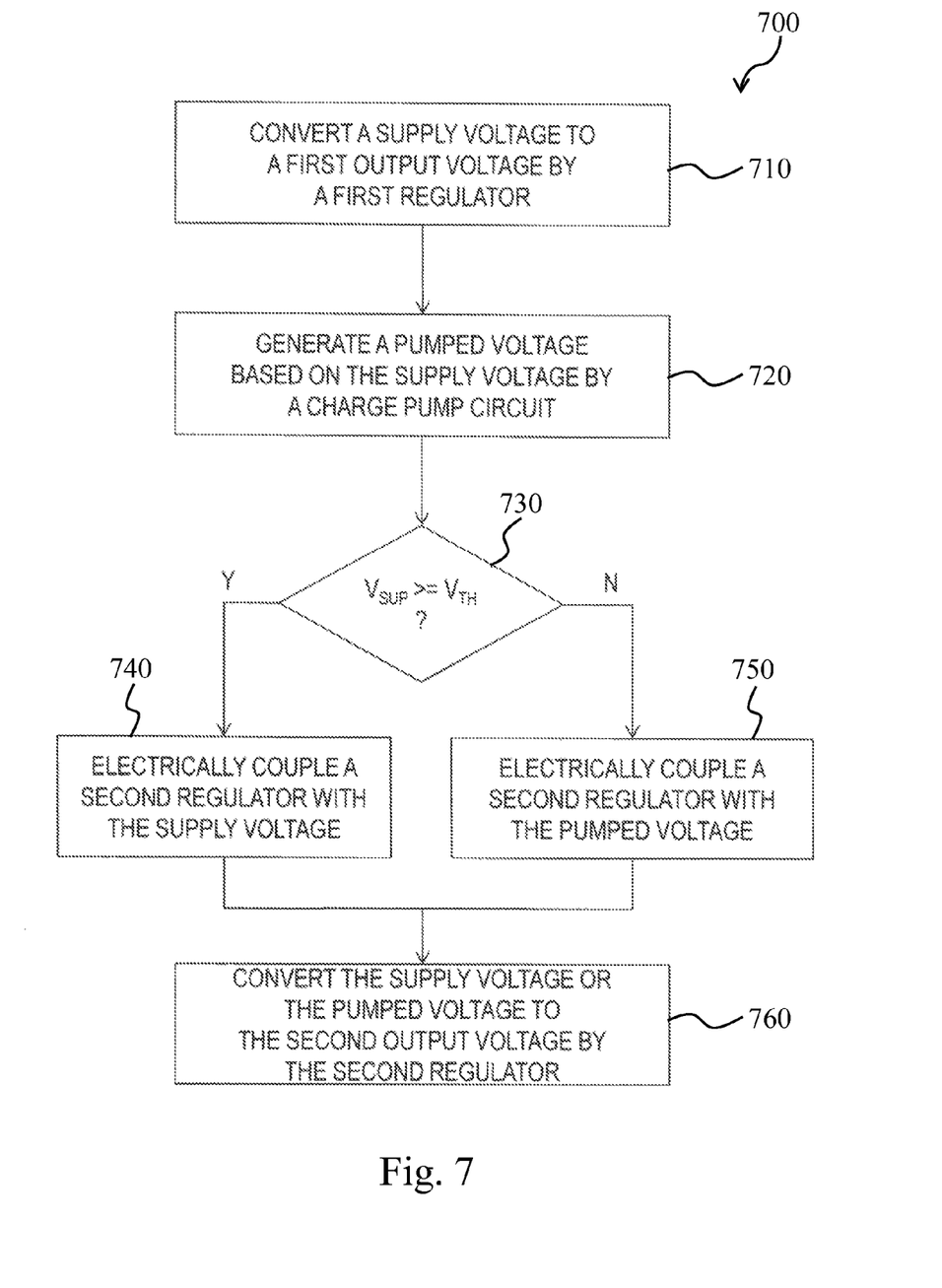
FIG. 7 is a flow chart of a method of operating an IP block portion of an IC in accordance with some embodiments.

FIG. 7 is a flow chart of a method 700 of operating an IP block portion of an IC in accordance with some embodiments. In some embodiments, method 700 is usable to operation IP block portion 100 depicted in FIG. 1 and further illustrated in conjunction with FIGS. 2-6C. It is understood that additional operations may be performed before, during, and/or after the method 700 depicted in FIG. 7, and that some other processes may only be briefly described herein.

The process begins with operation 710, where supply voltage $V_{SUPP}$ is converted to output voltage $V_{CORE}$ by regulator 140. In some embodiments, regulator 140 is a low dropout regulator. that such equivalent constructions do not depart from the spirit and scope of the present disclosure, and that they may make various changes, substitutions, and alterations herein without departing from the spirit and scope of the present disclosure.

The process proceeds to operation 720, where pumped voltage $V_{PP}$ is generated by charge pump system 220 or 500 based on supply voltage $V_{SUPP}$.

The process proceeds to operation 730, where comparison circuit 216 determines if the voltage level of supply voltage $V_{SUPP}$ is greater or less than a predetermined threshold voltage level $V_{TH}$.

When the voltage level of the supply voltage $V_{SUPP}$ is equal to or greater than the predetermined threshold voltage level $V_{TH}$, the process proceeds to operation 740, where regulator 212 is electrically coupled with supply voltage $V_{SUPP}$ through switch 214a.

When the voltage level of the supply voltage $V_{SUPP}$ is less than the predetermined threshold voltage level $V_{TH}$, the process proceeds to operation 750, where regulator 212 is electrically coupled with pumped voltage $V_{PP}$ through switch 214b.

The process proceeds to operation 760, where regulator 212 converts supply voltage $V_{SUPP}$ or pumped voltage $V_{PP}$ to output voltage $V_{MEM}$. In some embodiments, regulator 212 is a low dropout regulator.

Figure 8A:
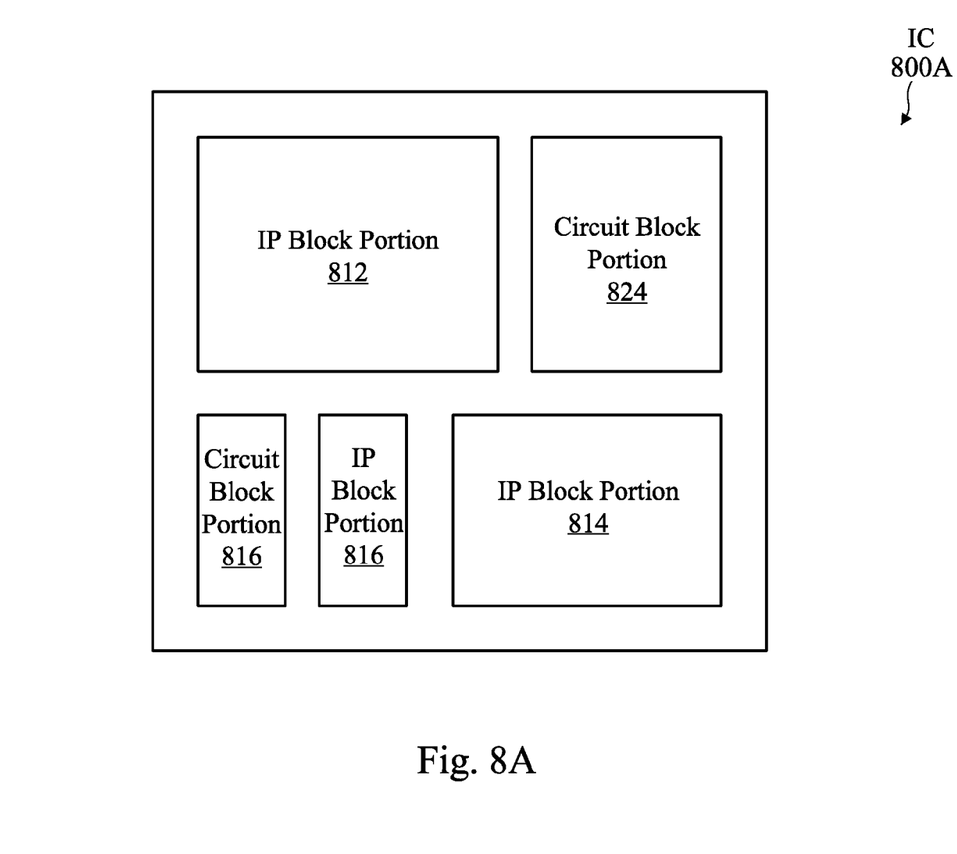
FIG. 8A is a top view of an IC having an IP block portion illustrated in conjunction with FIG. 1 in accordance with some embodiments.

FIG. 8A is a top view of an IC 800A having the IP block portion 100 depicted in FIG. 1 in accordance with some embodiments. Details of IC 800A are omitted for facilitating the illustration of an example application of IP block portion 100.

IC 800A includes IP block portions 812, 814, and 816 that are formed based on reusable IP circuit blocks. IC 800A also includes other circuit block portions 822 and 824 that are designed specifically for IC 800A and are not considered as reusable IP circuit blocks. In some embodiments, IP block portion 812 is a processor, IP block portion 814 is a memory, and IP block portion 816 is a mixed-mode circuit. In some embodiments, IP block portion 812, 814, or 816 includes a configuration consistent with IP block portion 100 illustrated in conjunction with FIGS. 1-6C. In some embodiments, circuit block portion 822 is an input-output interface, and circuit block portion 822 is a logic circuit.

Figure 8B:
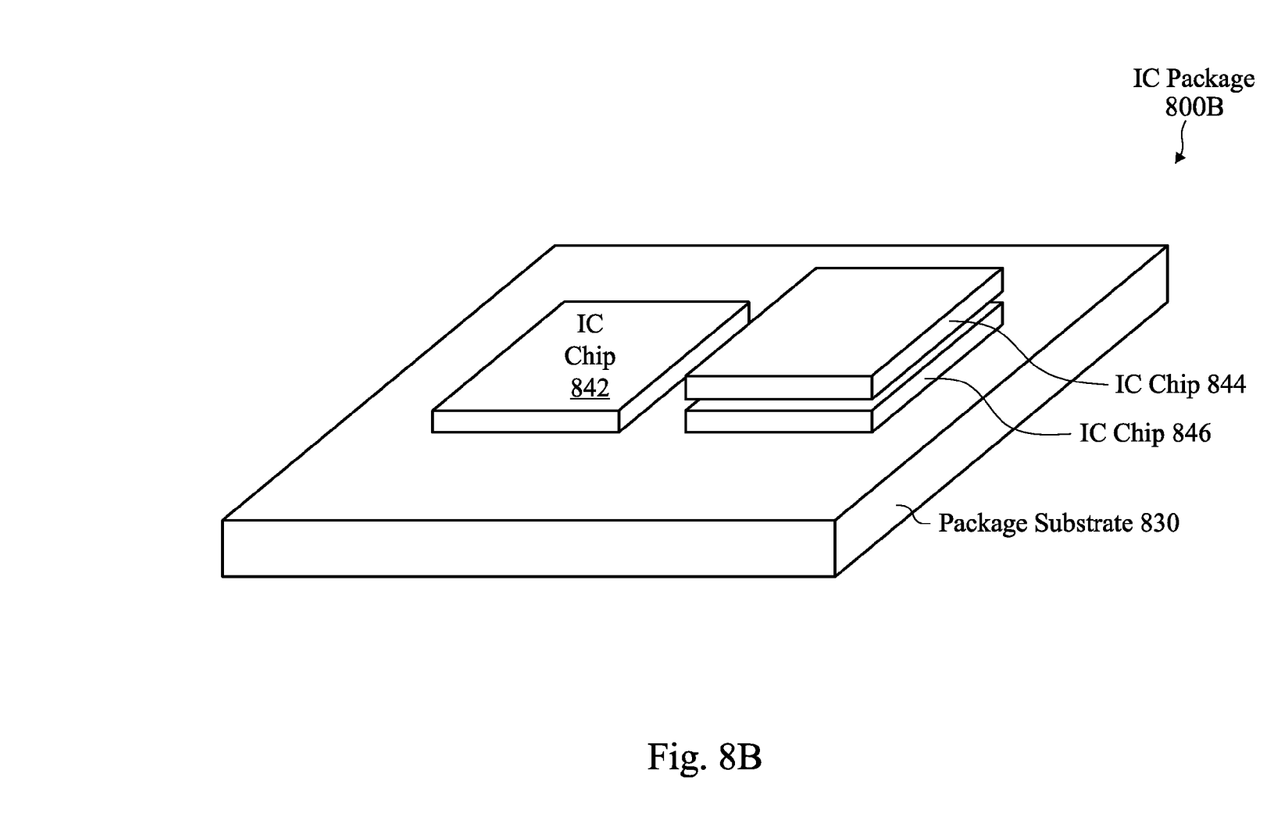
FIG. 8B is a perspective view of an IC package having an IP block portion illustrated in conjunction with FIG. 1 in accordance with some embodiments.

FIG. 8B is a perspective view of an IC package 800B having the IP block portion 100 depicted in FIG. 1 in accordance with some embodiments. Details of IC package 800B are omitted for facilitating the illustration of an example application of IP block portion 100.

IC package 800B includes a package substrate 830 and IC chips 842, 844, and 846. IC chip 842 is mounted on package substrate 830. IC chip 844 is mounted on IC chip 846, and the stack of IC chips 844 and 846 is also mounted on package substrate 830. In some embodiments, IC chip 842, 844, or 846 includes an IP block portion that is formed based on a marketplace IP circuit design and has a configuration consistent with IP block portion 100 illustrated in conjunction with FIGS. 1-6C.

In accordance with one embodiment, an intellectual property (IP) block portion in an integrated circuit includes a first regulator, a first circuit, a power converter, and a second circuit. The first regulator is configured to receive a supply voltage and to generate a first output voltage. The first circuit is coupled with the first regulator and configured to receive the first output voltage. The power converter includes a charge pump configured to receive the supply voltage and to generate a pumped voltage; and a second regulator configured to receive the supply voltage or the pumped voltage and to generate a second output voltage. The second output voltage has a voltage level greater than a voltage level of the first output voltage. The second circuit is coupled with the power converter and configured to receive the second output voltage.

In accordance with another embodiment, a power converter includes a charge pump and a regulator system. The charge pump is configured to receive a supply voltage and to generate a pumped voltage. The regulator system includes a low dropout regulator, a first switch, and a second switch. The low dropout regulator is configured to receive a input voltage and to generate an output voltage. The first switch is configured to pass the supply voltage to the low dropout regulator as the input voltage when a voltage level of the supply voltage is equal to or greater than a first predetermined voltage level. The second switch is configured to pass the pumped voltage to the low dropout regulator as the input voltage when the voltage level of the supply voltage is less than the first predetermined voltage level.

In accordance with another embodiment, a method of operating an intellectual property (IP) block portion in an integrated circuit includes converting a supply voltage to a first output voltage by a first regulator of the IP block portion. A pumped voltage is generated based on the supply voltage by a charge pump circuit of the IP block portion. The supply voltage or the pumped voltage is converted to a second output voltage by a second regulator of the IP block portion. A voltage level of the second output voltage is greater than a voltage level of the first output voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An intellectual property (IP) block portion in an integrated circuit, the IP block portion comprising:
a first regulator configured to receive a supply voltage and to generate a first output voltage;
a first circuit coupled with the first regulator and configured to receive the first output voltage;
a power converter, comprising:
a charge pump configured to receive the supply voltage and to generate a pumped voltage;
a second regulator configured to receive the supply voltage or the pumped voltage and to generate a second output voltage, the second output voltage having a voltage level greater than a voltage level of the first output voltage;
a first switch configured to pass the supply voltage to the second regulator when a voltage level of the supply voltage is equal to or greater than a first predetermined voltage level; and
a second switch configured to pass the pumped voltage to the second regulator when the voltage level of the supply voltage is less than the first predetermined voltage level; and
a second circuit coupled with the power converter and configured to receive the second output voltage.

2. The IP block portion of claim 1, wherein
the first regulator is a first low dropout regulator; and
the second regulator is a second low dropout regulator.

3. The IP block portion of claim 1, wherein
the power converter further comprises:
a comparison circuit configured to generate one or more control signals based on whether the voltage level of the supply voltage is greater or less than the first predetermined voltage level; and
the first switch and the second switch are controlled by the one or more control signals.

4. The IP block portion of claim 3 further comprising:
a reference voltage generator configured to generate a first reference voltage,
wherein the comparison circuit is configured to receive the first reference voltage.

5. The IP block portion of claim 3 further comprising:
a voltage divider configured to generate a first divided voltage based on the supply voltage and a first predetermined voltage-dividing ratio,
wherein the comparison circuit is configured to receive the first divided voltage.

6. The IP block portion of claim 1, wherein the power converter further comprises:
an oscillator configured to output a clock signal, wherein the charge pump is configured to operate based on the clock signal; and
a detection circuit configured to enable or disable the oscillator based on whether a voltage level of the pumped voltage is greater or less than a second predetermined voltage level.

7. The IP block portion of claim 6, wherein the power converter further comprises:
a reference voltage generator configured to generate a second reference voltage,
wherein the detection circuit is configured to receive the second reference voltage.

8. The IP block portion of claim 6, wherein the power converter further comprises:
a voltage divider configured to generate a second divided voltage based on the pumped voltage and a second predetermined voltage-dividing ratio,
wherein the detection circuit is configured to receive the second divided voltage.

9. The IP block portion of claim 6, wherein the oscillator is configured to output the clock signal at a plurality of different, non-zero, frequencies in response to one or more selection signals.

10. The IP block portion of claim 6, wherein
the detection circuit comprises a discharge circuit configured to lower the voltage level of the pumped voltage; and
the detection circuit is further configured to enable the discharge circuit in response to a discharge signal.

11. A method of operating an intellectual property (IP) block portion in an integrated circuit, the method comprising:
converting a supply voltage to a first output voltage by a first regulator of the IP block portion;
generating a pumped voltage based on the supply voltage by a charge pump circuit of the IP block portion; and
converting the supply voltage or the pumped voltage to a second output voltage by a second regulator of the IP block portion, a voltage level of the second output voltage being greater than a voltage level of the first output voltage,
wherein converting the supply voltage or the pumped voltage to the second output voltage comprises:
electrically coupling the second regulator with the supply voltage when a voltage level of the supply voltage is equal to or greater than a predetermined voltage level; and
electrically coupling the second regulator with the pumped voltage when the voltage level of the supply voltage is less than the predetermined voltage level.

12. A power converter, comprising:
a charge pump configured to receive a supply voltage and to generate a pumped voltage;
a regulator system, comprising:
a low dropout regulator configured to receive an input voltage and to generate an output voltage;
a first switch configured to pass the supply voltage to the low dropout regulator as the input voltage when a voltage level of the supply voltage is equal to or greater than a first predetermined voltage level; and
a second switch configured to pass the pumped voltage to the low dropout regulator as the input voltage when the voltage level of the supply voltage is less than the first predetermined voltage level;
an oscillator configured to output a clock signal responsive to an enable signal, wherein the charge pump is configured to operate based on the clock signal; and
a detection circuit comprising a comparator, the comparator being configured to generate a comparison result by comparing a first reference voltage and a first divided voltage, and the detection circuit being configured to generate the enable signal based on the comparison result,
wherein
the voltage level of the supply voltage being equal to, greater than, or less than the first predetermined voltage level is determined based on a second reference voltage, and
the second reference voltage is based on the first predetermined voltage level and is independent of the output voltage.

13. The power converter of claim 12, wherein the regulator system further comprises:
- a comparison circuit configured to generate one or more control signals based on comparing the second reference voltage and a second divided voltage;

the first switch and the second switch are controlled by the one or more control signals; and the power converter further comprises:
- a reference voltage generator configured to generate the second reference voltage; and
- a voltage divider configured to generate the second divided voltage based on the supply voltage and a predetermined voltage-dividing ratio.

14. The power converter of claim 12, further comprising:
a reference voltage generator configured to generate the first reference voltage; and
a voltage divider configured to generate the first divided voltage based on the pumped voltage and a predetermined voltage-dividing ratio.

15. The power converter of claim 12, wherein the oscillator is configured to output the clock signal at a plurality of different, non-zero, frequencies in response to one or more selection signals.

16. The power converter of claim 12, further comprising:
a discharge circuit configured to lower a voltage level of the pumped voltage in response to a discharge signal.

17. The method of claim 11, wherein converting the supply voltage or the pumped voltage to the second output voltage comprises electrically coupling an input of the second regulator with a switching device that is configured to receive both the supply voltage and the pumped voltage.

18. The method of claim 11, wherein converting the supply voltage or the pumped voltage to the second output voltage comprises:
generating a reference voltage;
generating a divided voltage based on the supply voltage and a predetermined voltage-dividing ratio; and
generating one or more control signals based on a comparison between the reference voltage and the divided voltage.

19. The IP block portion of claim 1, wherein the second regulator is configured to receive both the supply voltage and the pumped voltage.

* * * * *